United States Patent [19]

Zaehringer et al.

[11] Patent Number: 4,696,018
[45] Date of Patent: Sep. 22, 1987

[54] DIGITAL FM DETECTOR FOR DIGITIZED FM SIGNALS

[75] Inventors: Edmund Zaehringer, Bad Krozingen; Peotr Baker, Allington; Rolf Zettel, Denzlingen, all of Fed. Rep. of Germany

[73] Assignee: ITT Industries, Inc., New York, N.Y.

[21] Appl. No.: 684,717

[22] Filed: Dec. 21, 1984

[30] Foreign Application Priority Data

Dec. 24, 1983 [EP] European Pat. Off. ........... 83113112

[51] Int. Cl.$^4$ .................... H03D 3/18; H04L 27/06
[52] U.S. Cl. ........................... 375/82; 375/94; 329/104
[58] Field of Search ............... 375/80, 82, 88, 94, 375/102; 328/140; 329/104

[56] References Cited

U.S. PATENT DOCUMENTS 4,506,228  3/1985  Kammeyer ........................... 375/82

Primary Examiner—Robert L. Griffin
Assistant Examiner—M. Huseman
Attorney, Agent, or Firm—Thomas L. Peterson

[57] ABSTRACT

Digitized FM signals are fed to a sample-and-hold circuit followed by a first sampling stage which is clocked by a second sampling signal whose frequency is an integral multiple of the frequency of a first sampling signal. The output of the first sampling stage is coupled to the input of an interpolating filter which is clocked by the second sampling signal, and whose output is sampled in a second sampling stage clocked by the second sampling signal. The output of the second sampling stage is coupled to the inputs of two zero-crossing detectors each of which drives a group-delay-controlled monostable multivibrator. The output signals of the latter are added with an average-value compensation signal in an adder whose output is sampled in a third sampling stage clocked by the second sampling signal, and fed to a digital conversion filter clocked by the first and second sampling signals and a third sampling signal. The frequency of the third sampling signal is an integral submultiple of the frequency of the second sampling signal.

8 Claims, 10 Drawing Figures

DIGITAL FM DETECTOR FOR DIGITIZED FM SIGNALS

BACKGROUND OF THE INVENTION

The present invention relates to a digital FM detector for FM signals digitized by means of a first sampling signal.

One of the conventional analog FM detection methods consists of band-pass filtering the analog FM signal, determining the instants of the zero crossings by means of an analog zero-crossing detector, triggering at the instants of positive- and/or negative-going zero crossings a monostable multivibrator which produces pulses of constant amplitude-time area, and summing these pulses by means of an integrator or a low-pass filter whose output provides the demodulated signal.

SUMMARY OF THE INVENTION

One object of the invention is to apply this principle which is commonly used in analog FM detectors to digital FM detection, i.e., to process an already digitized and, if necesary, digitally band-limited FM signal by purely digital means in such a way that the demodulated signal appears at the output of the digital FM detector in digital form.

Digitized FM signals are fed to a sample-and-hold circuit followed by a first sampling stage which is clocked by a second sampling signal whose frequency is an integral multiple of the frequency of a first sampling signal. The output of the first sampling stage is coupled to the input of an interpolating filter which is clocked by the second sampling signal, and whose output is sampled in a second sampled stage clocked by the second sampling signal. The output of the second sampling stage is coupled to the inputs of two zero-crossing detectors each of which drives a group-delay-controlled monostable multivibrator. The output signal of the latter are added with an average-value compensation signal in an adder whose output is sampled in a third sampling stage clocked by the second sampling signal, and fed to a digital conversion filter clocked by the first and second sampling signals and a third sampling signal. The frequency of the third sampling signal is an integral submultiple of the frequency of the second sampling signal.

One advantage of the invention is that exclusively digital subcircuits are necessary to implement the detector, which is thus especially suited for integration using insulated-gate field-effect transistor circuits (MOS technology).

BRIEF DESCRIPTION OF THE DRAWINGS

Further advantages of the invention will become apparent from the following description of the invention taken in conjunction with the accompanying drawings, in which.

DETAILED DESCRIPTION

Figure 1:
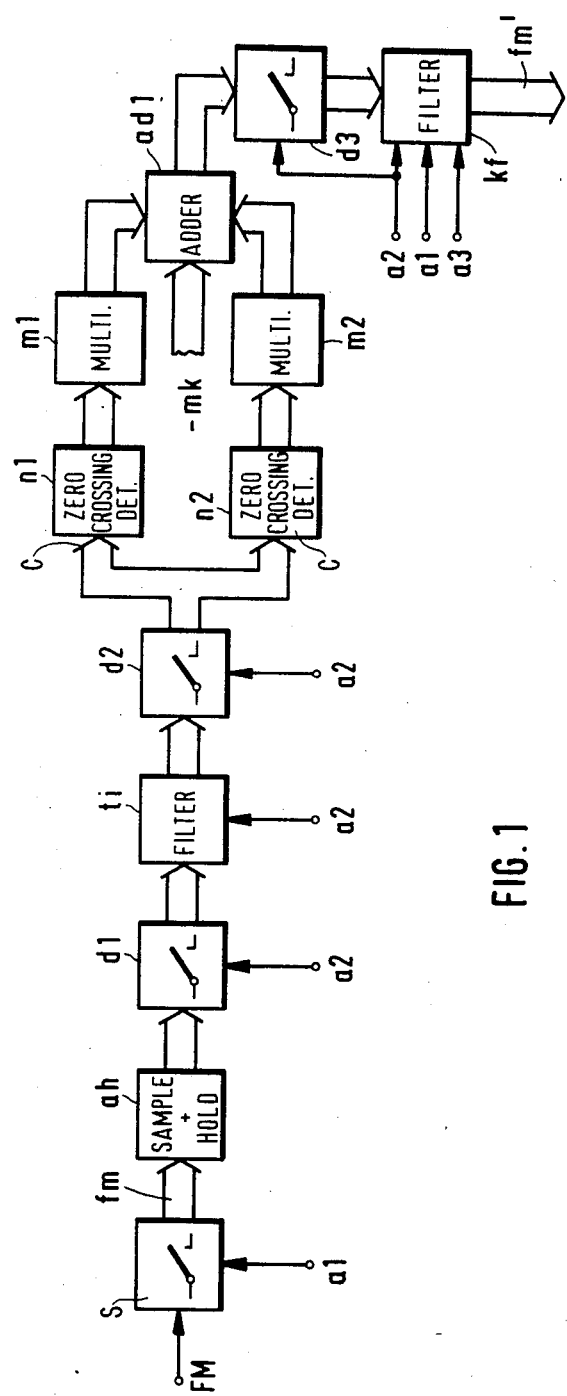
FIG. 1 is a block diagram of an embodiment of the invention.

In the block diagram of FIG. 1, sampling stage s receives the analog FM signal FM and the first sampling signal a1. The analog FM signal is sampled and is available at the output of this stage s as a digitized FM signal fm. In the simplest case, such a stage s is an analog-to-digital converter, but it may also be a digital filter with a desired characteristic which filters an FM signal already converted from analog to digital form. For the invention it is only of interest that a digitized FM signal fm is the input signal for the digital FM detector, and that this FM signal was digitized by means of a first sampling signal a1 of frequency f1, i.e., that the individual digital words of the FM signal fm follow each other successively in time at the sampling rate.

The digitized FM signals fm are applied to the sample-and-hold circuit ah, whose output is connected to the first sampling stage d1, which is clocked by the second sampling signal a2, whose frequency f2 is an integral multiple of the frequency f1 of the first sampling signal a1, so that $f2 = n \times f1$. During one period of the first sampling signal a1, n samples of the output signal of the sample-and-hold circuit ah are thus produced by the first sampling stage d1, so that each data word of the FM signal fm is changed into n data words.

The output of the first sampling stage d1 is coupled to the input of the digital interpolating filter ti, which is clocked by the second clock signal; the operation of this filter will be described below in connection with FIGS. 2 to 4. The output of the interpolating filter ti is connected to the input of the second sampling stage d2, which is clocked by the second sampling signal a2, too. The output of the second sampling stage d2 is connected to the input of the first zero-crossing detector n1 for positive-going zero crossings and to the input of the second zero-crossing detector n2 for negative-going zero crossings. The outputs of the two zero-crossing detectors n1 and n2 are connected to the inputs of the first and second group-delay-controlled monostable multivibrators m1 and m2, respectively. The first and second group-delay-controlled monostable multivibrators m1 and m2 may take the form of conventional digital monostable multivibrators whose inputs are connected to a common read-only memory as discussed in connection with FIG. 8. The read-only memory stores a linear interpolation formula discussed in connection with FIG. 4 and receives positive and negative samples from the second sampling stage d2. Sign information associated with the samples provided from the second sampling stage d2 are provided to the first and second zero crossing detectors n1 and n2 which are clocked at the same rate as the second sampling stage d2. The outputs of the first and second zero crossing detectors n1 and n2 are applied to the trigger inputs of the digital monostable multivibrators. The operation of these stages will be explained below in connection with FIGS. 5 and 6.

The output of each of the first and second monostable multivibrators m1, m2 is connected to one input of the first adder ad1, an additional input of which is presented with the average-value compensation signal −mk. The signal −mk represents the negative value of the quotient of the carrier frequency and the highest possible frequency of the analog frequency modulated signal FM. The output of the first adder ad1 is coupled to the input of the third sampling stage d3, which is clocked by the second sampling signal a2 and has its output connected to the input of the digital conversion filter kf. The latter is clocked by the first, second, and third sampling signals a1, a2, and a3, the frequency f3 of the third sampling signal a3 being an integral submultiple of the frequency f2 of the second sampling signal a2, so that f2=mxf3. The output of the conversion filter kf provides the demodulated digital FM signal fm'.

In a special embodiment of the invention, the interpolating filter ti and/or the conversion filter kf are linear digital filters. For this special case of the invention, FIGS. 2 to 4 show curves which serve to explain the invention. For the sake of clarity, the representation in these figures is generally analog although the signals to which the figures relate are all digital signals. It should also be noted that reference characters with an apostrophe refer to particular portions of the curves. Graph a of FIG. 2 shows the dashed waveform of the analog FM signal fm at 1', and the digtal FM signals fm, derived from the analog FM signal as described above, at 2'. The spacing of these digital signals is equal to the reciprocal of the frequency f1 of the first sampling signal a1.

Figure 2:
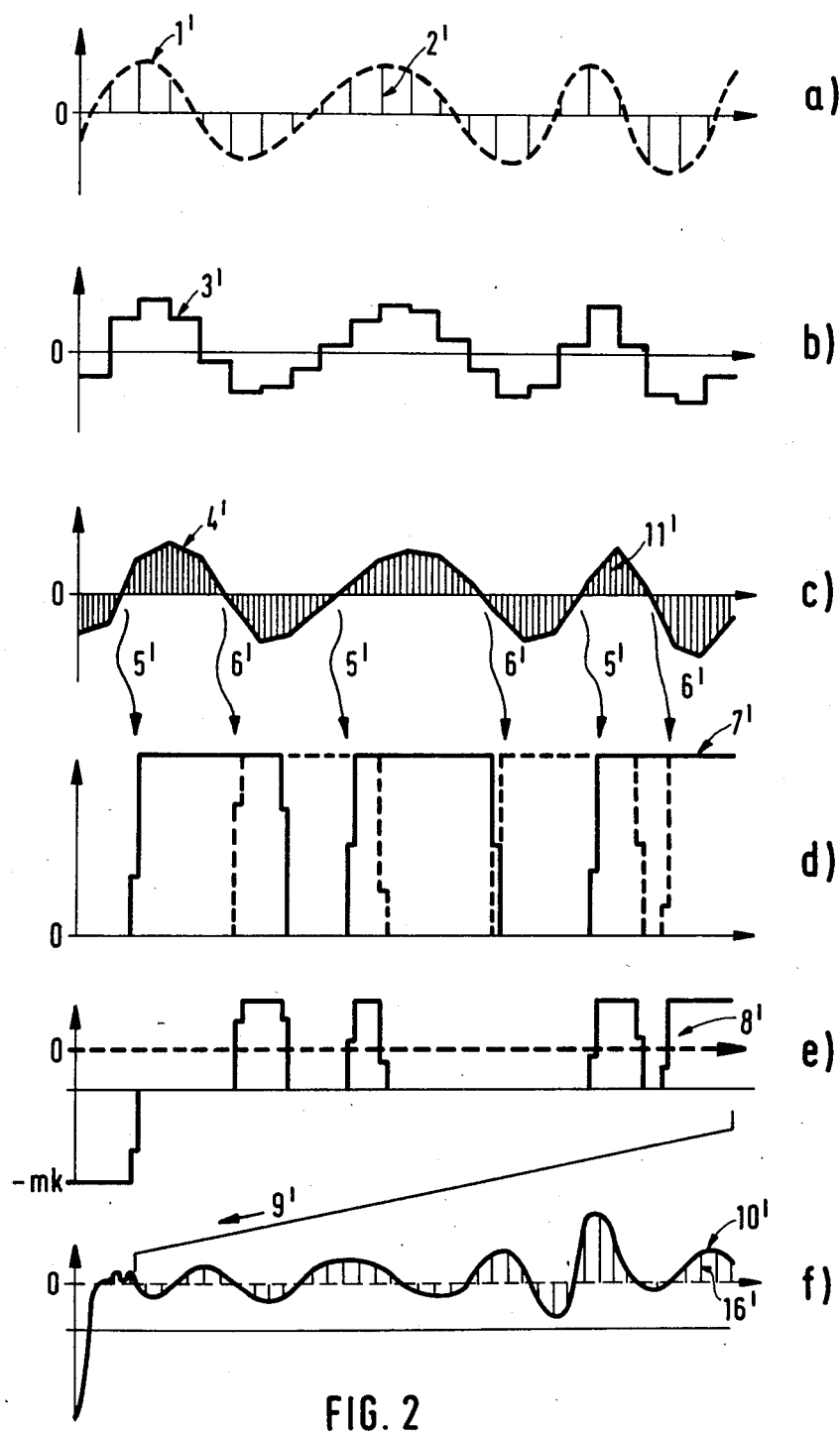
FIGS. 2 to 6 are various explanatory graphs.

Graph b of FIG. 2 shows the waveform at the output of the sample-and-hold circuit ah. At 3' it can be seen that the respective digital word of the FM signal fm is maintained constant for the period of the first sampling signal a1. The discrete time samples or digital words of the FM signal fm of graph a of FIG. 2 are thus changed into the staircase curve shown in graph b of FIG. 2.

By means of the linear interpolating filter ti, linear interpolation is now performed between two successive digital words of graph a of FIG. 2, so that the curve shown at 4' in graph c of FIG. 2 is obtained. Prior to this interpolation, however, the staircase curve of graph b of FIG. 2 was sampled in the first sampling stage d1 by means of the second sampling signal a2 of n times higher frequency, whose sample values are shown in graph c of FIG. 2 at 11'. The interpolated curve at 4' has positive-going zero crossings at 5' and negative-going zero crossings at 6'.

These zero crossings trigger the first and second group-delay-controlled monostable multivibrators m1 and m2, respectively.

Figure 3:
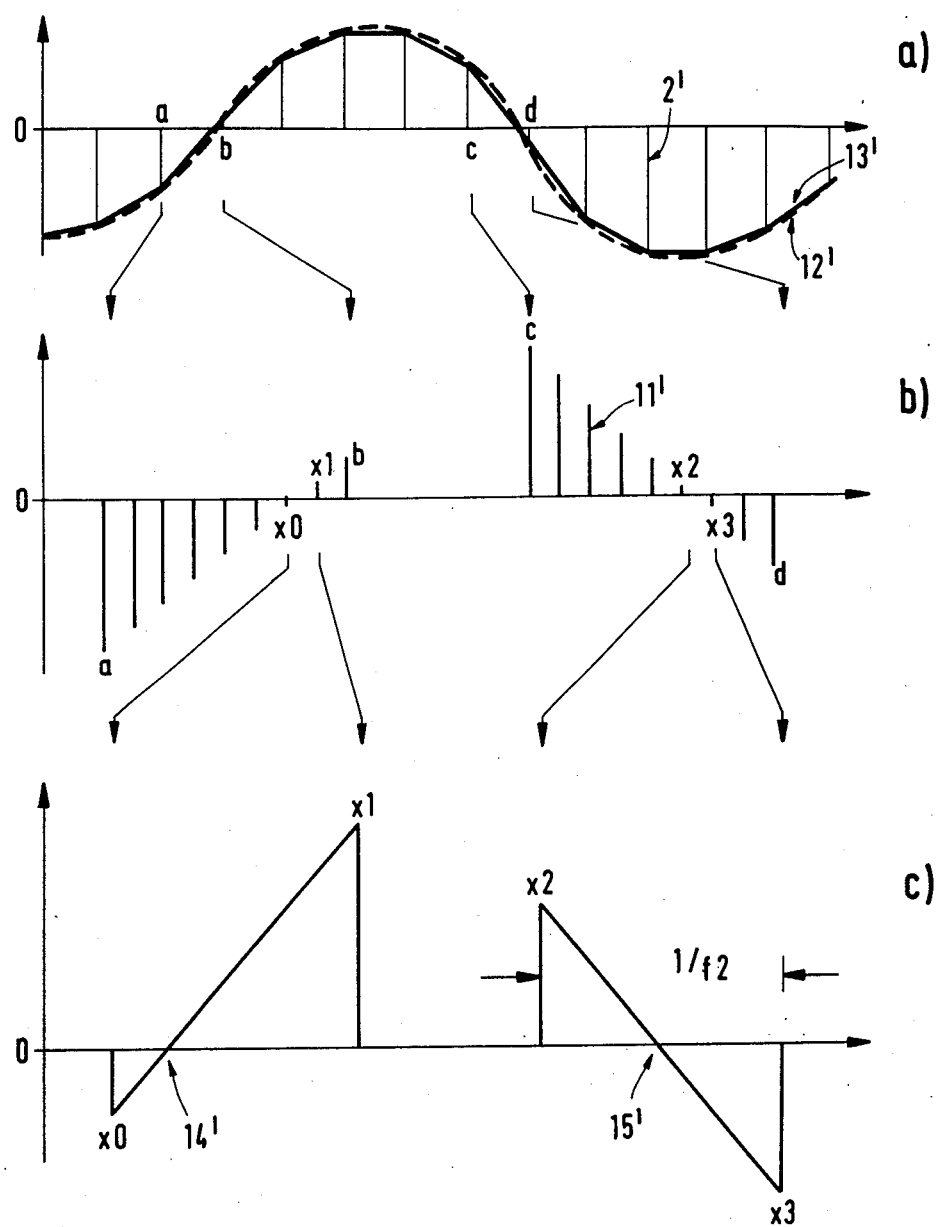

FIG. 3 illustrates the operation of the linear interpolating filter in an enlarged representation. In graph a of FIG. 3, the samples a, b lie before and after a positive-going zero crossing, and the samples c, d before and after a negative-going zero crossing. These samples correspond to the samples shown at 2' in graph a of FIG. 2, i.e., their sampling rate is equal to the frequency of the first sampling signal. The dashed waveform of the analog FM signal is shown at 12', while the solid curve at 13' is already the linear interpolated curve as in graph c of FIG. 2.

Graph b of FIG. 3. shows on an enlarged time scale how the samples shown at 11' in graph c of FIG. 2 lie on the left and right of the two zero crossings of graph a of FIG. 3, the n samples of graph c of FIG. 2 now lying between the samples a and b and the samples c and d of graph a of FIG. 3. The zero crossings are now between the samples x0 and x1 and the samples x2 and x3, respectively.

In graph c of FIG. 3, the precise locations of the zero crossings are shown at 14' and 15' on a further enlarged time scale.

Figure 4:
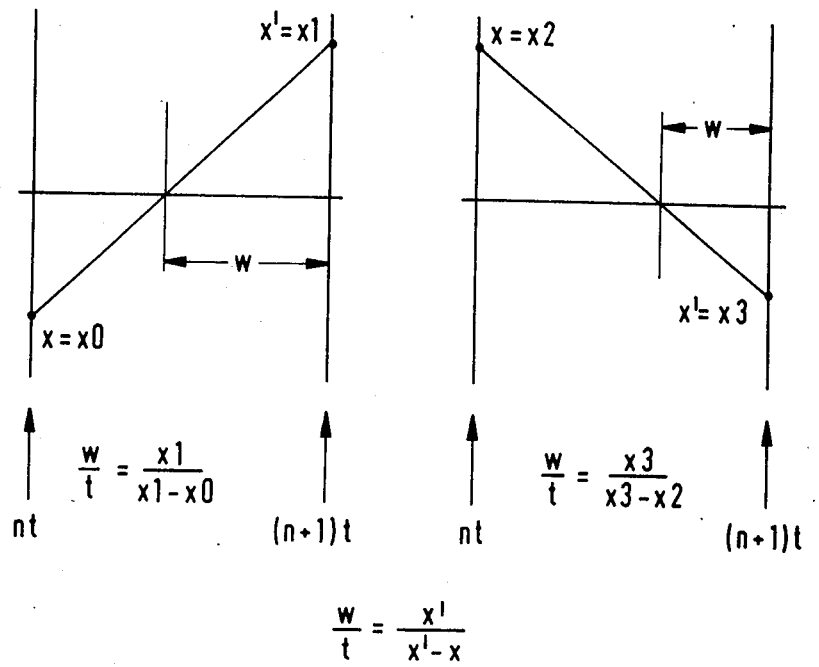

From this, the geometrical relations given in FIG. 4 can be derived. For two successive instants nt and (n+1)t of the second sampling signal a2, at which the samples x0, x1 and x2, x3 or, expressed generally, x and x' occur, the following relation holds: w/t=x'/(x'−x), where w is the time distance between the actual zero crossing and the instant (n+1)t.

Figure 6:
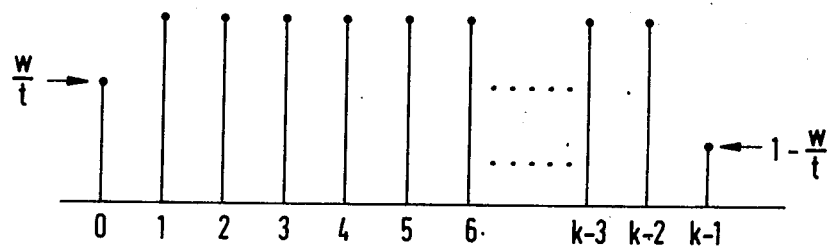
Figure 5:
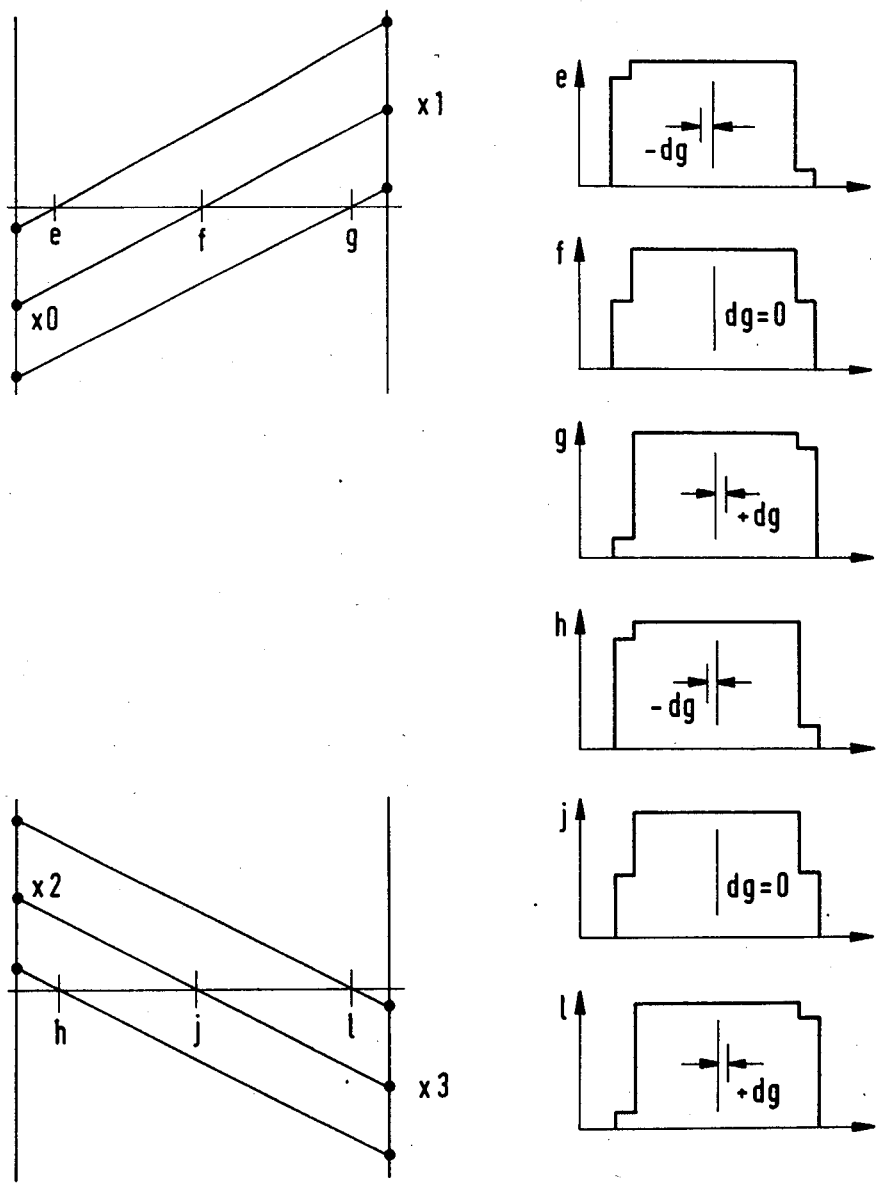

FIG. 6 shows schematically the number and amplitude of the k output pulses of the group-delay-controlled monostable multivibrators m1, m2, which are delivered at the repetition rate of the second sampling signal a2. The maximum possible value of k is equal to the quotient of the frequency f2 and the highest possible frequency of the analog FM signal FM. The equidistant, equal-amplitude pulses 1 to k−2 are "framed" by the pulses 0 and k−1, whose amplitudes are equal to w/t and 1−w/t, respectively. Through these two weighted pulses, the centers of the areas of the output pulses of the two monostable multivibrators m1, m2 are continuously shifted in time dependent on the zero crossings, as is shown in FIG. 5 for three cases e, f, g of a positive-going zero crossing and three cases h, j, l of a negative-going zero crossing. The six pulse areas shown in FIG. 5 on the right are assigned to the zero crossings e to l. The zero crossings, f, j show that a pulse of half the maximum amplitude occurs at the beginning and the end of each output pulse of the monostable multivibrator, i.e., that these areas have symmetrical shapes, so that their centers are located on the long line shown in the middle of the pulse areas, which can be regarded as the zero reference line for the deviation dg. For the zero crossings f, j, therefore, dg is zero.

By contrast, the zero crossing e causes a pulse area with a large initial w/t value and a correspondingly small final value and, consequently, a corresponding deviation −dg of the center of the area. Similarly, the zero crossing h causes a negative shift of the center of the area.

The zero crossings g, l have a low initial w/t value and, consequently, a high final value, so that the centers of the areas are shifted in the positive direction, i.e., the deviations are +dg. By means of the output pulses of the group-delay-controlled monostable multivibrators m1, m2, which were modified in accordance with w/t, the zero crossings, which are not precisely localizable because of the discrete time sampling, are thus determined again, so to speak. Accordingly, despite the application of digital principles based on several sampling operations, the demodulated FM Signal is practically free from sampling errors.

In graph d of FIG. 2, the envelopes of the output pulses of the two monostable multivibrators m1, m2 are shown at 7'; the pulses assigned to the positive-going zero crossings are shown by solid lines, and those assigned to the negative-going zero crossings by dashed lines. From these pulses and the average-value compensation signal −mk, which enters into the addition with a negative sign, the first adder ad1 forms a DC-compensated output signal as shown in graph e of FIG. 2. The arrow 8' again indicates that samples occur within the pulse areas at a sampling rate equal to the frequency f2.

The output signal of the first adder ad1 is sampled by the third sampling stage d3 at the frequency f2 of the second sampling signal and then band-limited by the conversion filter kf, as is indicated by the arrow 9' in graph f of FIG. 2. Thereafter, the sampling rate is reduced by the factor m. This is done in the conversion filter kf by means of the third sampling signal a3, whose frequency f3 is lower than the frequency f2 by the integral divisor m. Such samples are shown in graph f of FIG. 2 at 16'.

Figure 7:
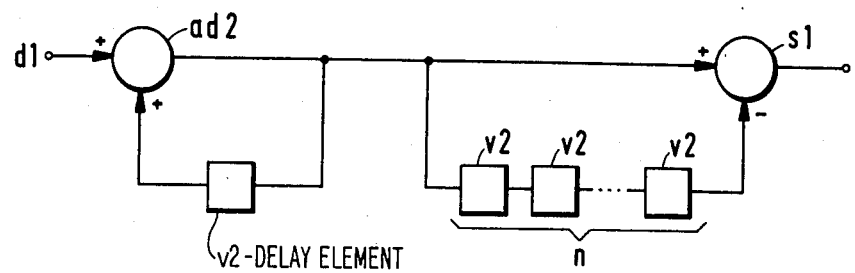
FIG. 7 is schematic circuit diagram of an embodiment of the interpolating filter used in the invention.

FIG. 7 shows a circuit diagram of a preferred embodiment of a linear interpolating filter ti. The filter consists of the second adder ad2, one input of which is presented with the output signal of the first sampling stage d1, while the other input is fed with the output signal of this adder through the delay element v2. This delay element v2 produces a time delay equal to the reciprocal of the frequency f2. The output signal of the second adder ad2 is also applied to the minuend input of the subtracter s1 and, through n cascaded delay elements v2, to the subtrahend input of this subtracter. This digital filter has the transfer function $T(z)=(1-z^{-n})/(1-z^{-1})$, where z is the discrete time variable.

Figure 8:
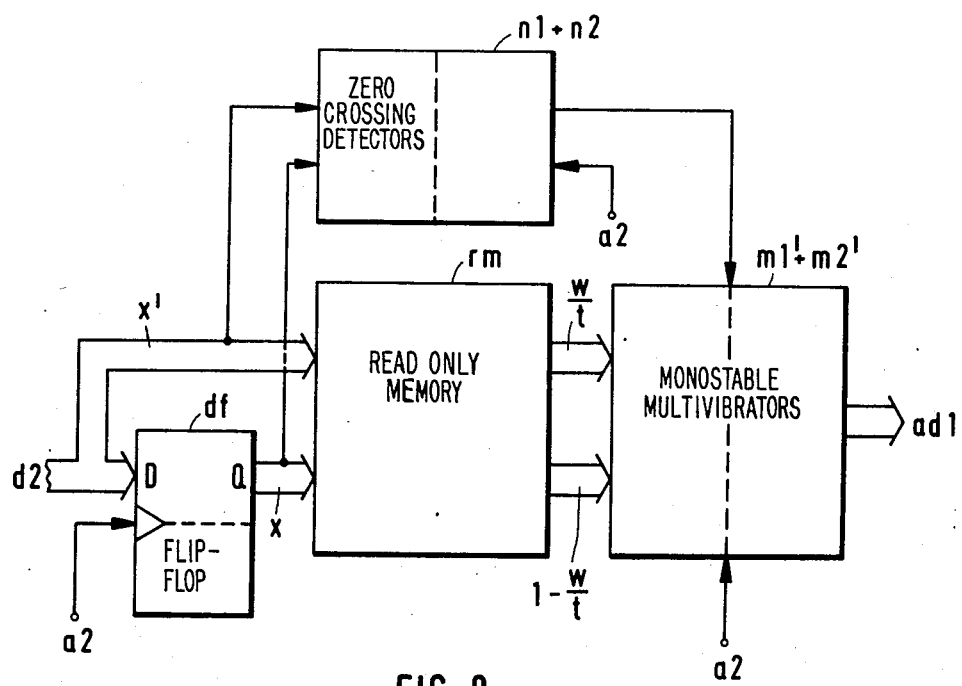
FIG. 8 is a block diagram of an embodiment of the zero-crossing detectors and group-delay-controlled digital monostable multivibrators used in the invention.

FIG. 8 shows preferred embodiments of the zero-crossing detectors n1, n2 and the digital monostable multivibrators m1, m2. In the read-only memory rm, the linear interpolation formula according to FIG. 4, $w/t - x'/(x'-x)$, is stored. To ensure that the signals occuring before and after a zero crossing are applied simultaneously to the two inputs of the read-only memory rm, the D flip-flop df is provided, whose D input is presented with the output signal of the second sampling stage d2, while its Q output, which provides the signal x according to FIG. 4, is connected to one of the inputs of the read-only memory rm. The other input of the read-only memory is connected directly to the output of the second sampling stage d2, which provides the signal x' according to FIG. 4. The clock input of the D flip-flop is fed with the second sampling signal a2.

The sign bits of the output signals of the second sampling stage d2 and the Q output of the D flip-flop df are fed, respectively, to two inputs of the zero-crossing detectors n1, n2, which are followed by the trigger inputs of the digital monostable multivibrators m1', m2', which are clocked by the second clock signal a2. The outputs of the read-only memory rm for the signals w/t and 1−w/t are coupled to the digital monostable multivibrators m1', m2' in such a way that the output signals of the latter contain the aforementioned initial pulses w/t and final pulses 1−w/t.

Figure 9:
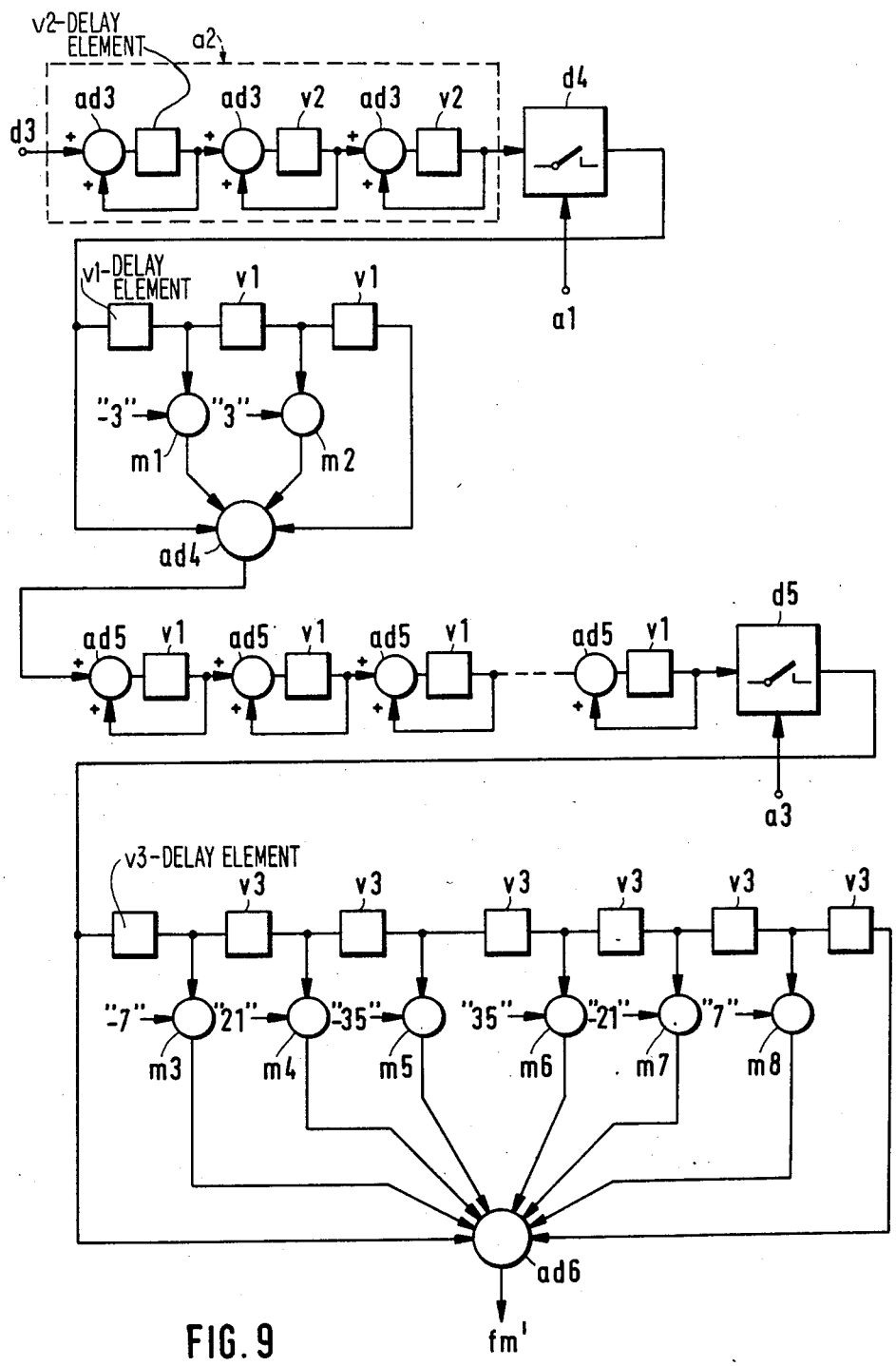
FIG. 9 is a schematic circuit diagram of an embodiment of the conversion filter used in the invention.

FIG. 9 shows a circuit diagram of a first preferred embodiment of the conversion filter kf. This digital filter consists of three sections which differ in that each of them is clocked by a different one of the three clock signals a1, a2, a3. The first section, i.e., the input section, is clocked by the second clock signal a2 and consists of three like subsections connected in a cascade arrangement. Located at the input end of each subsection is the third adder ad3, one input of which is fed directly with the signal to be filtered, and its output signal is applied to its other input through the delay element v2. The time delay produced by the delay element v2 is again equal to the period of the second sampling signal a2. The adders ad3 are clocked by clock signal a2. The delay elements v2 may for example each be implemented using a register clocked by clock signal a2 in the manner which is well known in the art. It should be pointed out that those skilled in the art will appreciate that the clock signal connections in the various sections are not shown in their entirety for clarity. The output signal of the cascade arrangement of three like subsections is fed to the fourth sampling stage d4, which is clocked by the first clock signal a1. The output of this sampling stage is coupled to the cascade arrangement of three delay elements v1, each of which provides a delay equal to the period of the first clock signal a1. The two junction points between the three cascaded delay elements v1 are respectively connected through the first and second multipliers m1, m2 to two inputs of the fourth adder ad4, which also has the input and output of the cascade arrangement of delay elements v1 connected to it. The second inputs of the multipliers m1, m2 are presented with signals corresponding to the decimal numerical values −3 and 3, respectively, which is indicated in FIG. 9 by the quotation marks before and after −3 and 3.

The output of the fourth adder ad4 is coupled to the input of the cascade arrangement of seven like subsections each consisting of the fifth adder ad5 at the input end and the delay element v1, which again provides a delay equal to the period of the first clock signal a1 and has its output connected to the second input of the fifth adder ad5.

The second of the filter sections extends from the input of the fourth sampling stage d4 to the output of the last delay element v1 of the last-mentioned cascade arrangement of seven like stages.

Figure 10:
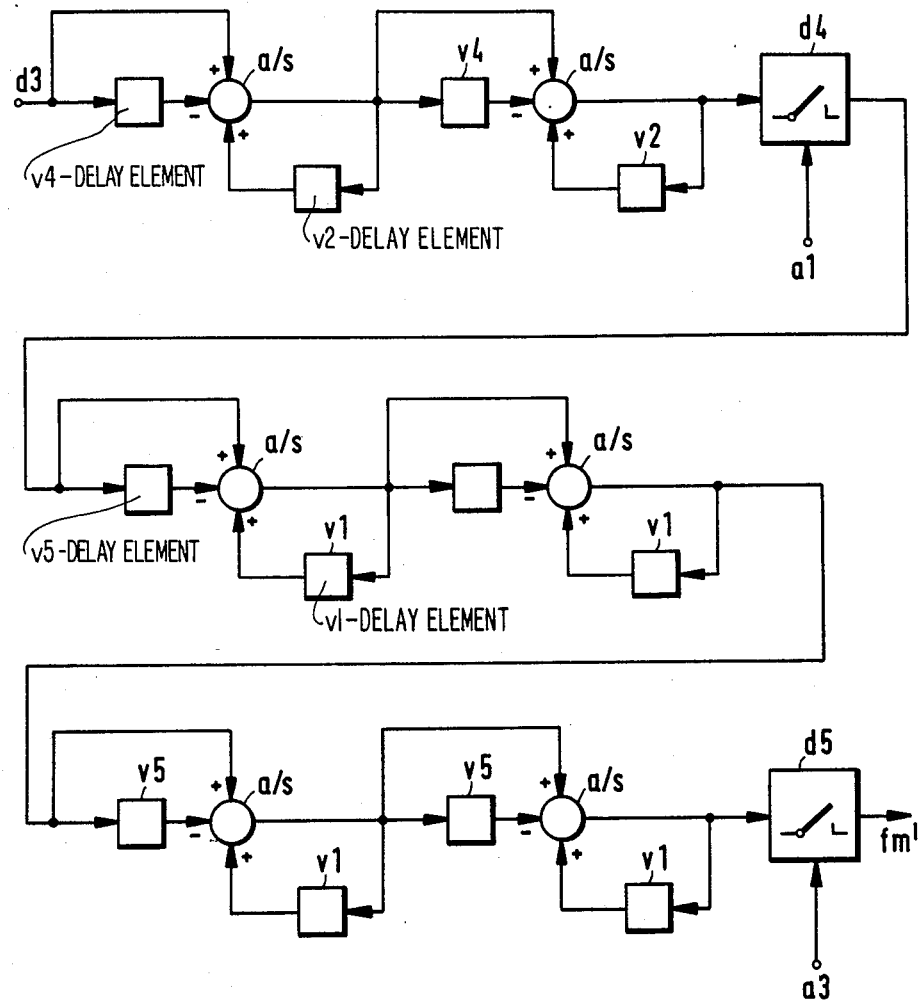
FIG. 10 is a schematic circuit diagram of another embodiment of the conversion filter.

The third filter section begins with the fifth sampling stage d5, which is clocked by the third clock signal a3 and has its input connected to the output of the last delay element v1 of the cascade arrangement of the second filter section. The output of the fifth sampling stage d5 is coupled to the cascade arrangement of seven delay elements v3, each of which produces a time delay equal to the period of the third clock signal a3. Each of the inner junction points of this cascade arrangement is connected through a multiplier m3, m4, m5, m6, m7, m8 to one input of the sixth adder ad6, which has two additional inputs connected to the input and the output, respectively, of the cascade arrangement of delay elements v3. A signal corresponding to the decimal numerical value is applied to the second input of each of the multipliers m3 to m8. The numerical values applied to the multipliers in the order of m3 to m8 are as follows: −7; 21; −35; 35; −21; 7. FIG. 10 shows another embodiment of the conversion filter kf. Compared with the embodiment of FIG. 9, this embodiment has no multipliers, which makes it easier to implement the circuit with integrated, circuit technology. The first filter section, located ahead of the fourth sampling stage d4, consists of two like subsections each composed of the delay element v4 the adder-subtracter a/s, and the delay element v2. The delay element v4 and the adder-subtracter are connected in cascade. The output signal of the delay element v4 is applied to the subtrahend input of the adder-subtracter a/s, while the two minuend inputs are presented, respectively, with the input signal and the output signal of the adder-subtracter, the latter signal being fed back through the delay element v2. The time delay produced by the delay element v4 is equal to 2n times the period of the second clock signal a2, while the time delay produced by the delay element v2 is equal to the period of this signal. The transfer function of this first filter section consisting of two cascaded subsections is: $T(z)=(1-z^{-2n})^2/(1-z^{-1})^2$.

The second filter section begins with the fourth sampling stage d4 and further comprises the cascade arrangement of four like subsections which correspond in design to the subsections of the first filter section except that delay elements v5 ahead of the adder-subtracters a/s and delay elements v1 are used. The time delay produced by the delay element v5 is equal to m times the period of the first clock signal a1, and that produced by the delay element v1 is equal to this period.

In the embodiment of FIG. 10, the last-mentioned cascade arrangement of four like stages is again followed by the fifth sampling stage d5, which is clocked by the third sampling signal a3, and whose output provides the demodulated digital FM signal fm'. The transfer function of the second filter section is $T(z) = (1-z^{-m})^4/(1-z^{-1})^4$.

In certain applications, it may be advantageous to place a digital limiter between the output of the interpolating filter ti and the input of the second sampling stage d2, for it will not generally be necessary to process the entire word width of the output signal of the interpolating filter ti. It may be sufficient to process the word width present at the input of the interpolating filter. The limiting action is performed on the high-order bits of the output signal of the interpolating filter, because essentially only the zero crossings are of interest in the following stages.

What is claimed is:

1. A digital FM detector for FM signals digitized by means of a first sampling signal, said detector comprising:

a sample and hold circuit receiving said digitized FM signals and having an output;

a first sampling stage coupled to said sample and hold circuit output and clocked by a second sampling signal at a frequency which is an integral multiple of the frequency of the first sampling signal;

a digital interpolating filter having an input coupled to said first sampling stage, and being clocked by said second sampling signal;

a second sampling stage coupled to said digital interpolating filter and clocked by said second sampling signal;

a first zero crossing detector for detecting positive going zero crossings coupled to said second sampling stage;

a first group delay controlled multivibrator coupled to the output of said first zero-crossing detector;

a second zero-crossing detector for detecting negative going zero crossings coupled to said second sampling stage;

a second group delay controlled multivibrator coupled to the output of said second zero-crossing detector;

an adder for adding the outputs of said first and second multivibrators and an average-value compensation signal identical with the quotient of the carrier frequency and the maximum possible frequency of the analog FM signals;

a third sampling stage having its intput coupled to the output of said adder and clocked by said second sampling signal, a digital conversion filter coupled to the output of said third sampling stage and clocked by said first and second sampling signals and a third sampling signal having a frequency which is a submultiple of said second sampling signal frequency.

2. A digital FM detector in accordance with claim 1, wherein:

said interpolating filter is a linear digital filter.

3. A digital FM detector in accordance with claim 2, wherein:

said conversion filter is a linear digital filter.

4. A digital FM detector in accordance with claim 1, wherein:

said conversion filter is a linear digital filter.

5. A digital FM detector in accordance with claim 1 comprising:

a digital limiter inserted between the output of said interpolating filter and the input of said second sampling stage.

6. A digital FM detector in accordance with claim 1 wherein:

said first and second group-delay-controlled monostable multivibrators comprise a common read-only memory and first and second digital monostable multivibrators following said read-only memory;

for two samples x, x' occurring as input signals at intervals of two successive pulses of said second sampling signal, the two values resulting from linear interpolation, $x'/(x'-x)$ and $1-x'/(x'-x)$, are stored as output signals in said read-only memory; and outputs of said read-only memory for said values $x'/(x'-x)$ and $1-x'/(x'-x)$ are coupled to the inputs of said first and second digital monostable multivibrators such that the output signals of the latter contain said two signals as initial pulses and final pulses, respectively.

7. A digital FM Detector in accordance with claim 6 comprising a D flip-flop for deriving said two samples x, x' from the output of said second sampling stage, said D flip-flop being clocked by said second sampling signal.

8. A digital FM detector in accordance with claim 7 wherein:

said first and second zero-crossing detectors have two inputs connected to sign-bit output terminals of said second sampling stage and said D flip-flop, respectively, and the outputs of said first and second zero-crossing detectors are coupled to the trigger inputs of the associated digital monostable multivibrators.

* * * * *